(12) United States Patent
Minas et al.

(10) Patent No.: US 8,680,874 B2
(45) Date of Patent: Mar. 25, 2014

(54) ON-CHIP TESTING USING TIME-TO-DIGITAL CONVERSION

(75) Inventors: Nikolaos Minas, Kessel-Lo (BE); Erik Jan Marinissen, Leuven (BE)

(73) Assignee: IMEC, Leuven (BE)

( * ) Notice: Subject to any disclaimer, the term of this patent is extended or adjusted under 35 U.S.C. 154(b) by 355 days.

(21) Appl. No.: 13/194,818

(22) Filed: Jul. 29, 2011

(65) Prior Publication Data

US 2012/0025846 A1 Feb. 2, 2012

Related U.S. Application Data

(60) Provisional application No. 61/369,633, filed on Jul. 30, 2010.

(51) Int. Cl.
*G01R 27/02* (2006.01)

(52) U.S. Cl.
USPC ............................................ 324/606; 324/679

(58) Field of Classification Search
USPC ................................ 324/606, 658, 679, 76.11
See application file for complete search history.

(56) References Cited

U.S. PATENT DOCUMENTS

2007/0001682 A1* 1/2007 Habitz et al. .................. 324/500
2010/0013512 A1   1/2010 Hargan et al.

FOREIGN PATENT DOCUMENTS

WO    WO 01/86314 A2    11/2001
WO    WO 2006/067733 A1  6/2006

OTHER PUBLICATIONS

Tsai et al., "Through Silicon Via (TSV) Defect/Pinhole Slef Test Circuit for 3D-IC", IEEE International 3D System Integration Conference (3D-IC'09), San Francisco, CA Sep. 2009 (http://ieeexplore.ieee.org/stamp/stamp.jsp?tp=&arnumber=5306569 &isnumber=5306519) (Menglin et al.).
Chen et al., "On-Chip TSV Testing for 3D IC before Bonding Using Sense Amplification", National Tsing Hua University, ITRI, IEEE Asian Test Symposium (ATS'09), Taichung, Taiwan, Nov. 2009, pp. 454-459 (http://ieeexplore.ieee.org/stamp/stamp.jsp?tp= &arnumber=5359278&isnumber=5359187) (Chen et al.).
Van Der Plas G et al., "Design issues and considerations for low-cost 3D TSV IC technology", Solid-State Circuits Conference Digest of Technical Papers (ISSCC), 2010 IEEE International, IEEE, Piscataway, NJ, USA, pp. 148-149.
European Search Report for European Patent Application No. EP 11175979 dated Nov. 4, 2011.

* cited by examiner

*Primary Examiner* — Vincent Q Nguyen
(74) *Attorney, Agent, or Firm* — Knobbe Martens Olson & Bear LLP

(57) ABSTRACT

A method and system for testing the functionality of a through-silicon-via in an integrated circuit is disclosed. In one aspect, the functionality is tested by measuring its capacitance from one side only. The capacitance of the TSV can be determined by measuring a timing delay introduced in a measurement circuit due to the presence of the TSV. The timing delay is determined by comparing the timing of measurement signal from the measurement circuit with the timing of a reference signal provided by a reference circuit. The comparison is carried out using a digital timing measurement circuit, such as a time-to-digital converter.

16 Claims, 6 Drawing Sheets

ON-CHIP TESTING USING TIME-TO-DIGITAL CONVERSION

CROSS REFERENCE TO RELATED APPLICATIONS

This application claims priority under 35 U.S.C. §119(e) to U.S. provisional patent application 61/369,633 filed on Jul. 30, 2010, which application is hereby incorporated by reference in its entirety.

BACKGROUND OF THE INVENTION

1. Field of the Invention

The disclosed technology relates to on-chip testing using time-to-digital conversion, and more particularly, although not exclusively, to testing of through-silicon-vias mounted on three-dimensional stacked integrated circuits.

2. Description of the Related Technology

The semiconductor industry is moving towards utilizing three-dimensional stacked ICs (3D-SICs) based on through-silicon-vias (TSVs). TSVs are conducting elements which extend out of the back-side of a thinned-down die or wafer and which enable a vertical interconnection to be made to another die. TSVs are high-density, low-capacity interconnects compared to traditional wire-bonds, and hence allow for many more interconnections between stacked dies or wafers, while operating at higher speeds and consuming less power. TSV-based 3D technologies enable the creation of a new generation of 'super chips' by opening up new architectural opportunities. Combined with their smaller form factor and lower overall manufacturing cost, 3D-SICs have many compelling benefits, and hence their technology is quickly gaining ground.

Like all micro-electronics, the manufacturing process of TSV-based die or wafer stacks is sensitive to defects, and hence 3D-SICs need to undergo electrical testing to filter out the defective dies or wafers to ensure product quality. Testing might take place before and/or after stacking, respectively known as pre-bond die tests and post-bond stack tests. The tests ideally cover not only intra-die defects, but also defects in TSV-based interconnects. A TSV-based interconnect consists of the TSV itself and the bond between the TSV tip in one die and the TSV landing pad in another die. In alternative implementations, the bond is made between two micro-bumps.

Conventionally, interconnects are tested by applying an electrical signal at one end of each interconnect and electrically observing the applied signal at the other end of the same interconnect. The correct and in-time arrival of the signal indicates the integrity of the particular interconnect being tested. However, this method of testing requires full electrical access to both sides of the interconnect being tested.

In pre-bond die testing on thick (not-yet-thinned) wafers, the TSVs are accessible from at most one side, as the other side is still deeply buried inside the (not-yet-thinned) wafer. A potential solution to this problem is to test the TSV on a thinned wafer where the TSVs are exposed on both sides and are no longer buried inside the substrate of the wafer. However, thinned wafers are very thin, typically having a thickness of between 25 μm and 50 μm, and hence are mechanically fragile. They tend to exist only in mounted form, mounted with some sort of glue on top of a carrier, for example, silicon or glass. This means that the front-side of the wafer is no longer available for probe access in the testing process. Probing on a thinned wafer is therefore, by definition, back-side probing only. Potentially, this could allow for dual-side access to the TSV as the TSV under test could be contacted at its exposed tip while the other side is accessed from the back-side via another TSV.

However, there many uncertainties involved with back-side probing of thinned wafers on a temporary carrier, including the risk of cracking and/or breaking of the thinned wafer, temporary and/or permanent damage to the circuitry and TSVs, etc. In addition, probing on exposed TSV tips or TSV-mounted micro-bumps is far from easy with probe technology currently in use as TSVs are too small, too fragile, and too numerous.

Two alternative approaches for single-side access for testing are known from articles entitled "Through Silicon Via (TSV) Defect/Pinhole Self Test Circuit for 3D-IC" by Menglin Tsai, Amy Klooz, Alexander Leonard, Jennie Appel, Paul Franzon (North Carolina State University), IEEE International 3D System Integration Conference (3D-IC'09), San Francisco, Calif., September 2009 (http://ieeexplore.ieee.org/stamp/stamp.jsp?tp=&arnumber=5306569&isnumber=5306519) (Menglin et al.); and entitled "On-Chip TSV Testing for 3D IC before Bonding Using Sense Amplification" by Po-Yuan Chen, Cheng-Wen Wu, Ding-Ming Kwai (National Tsing Hua University, ITRI), IEEE Asian Test Symposium (ATS'09), Taichung, Taiwan, November 2009, pages 454 to 459, (http://ieeexplore.ieee.org/stamp/stamp.jsp?tp=&arnumber=5359278& isnumber=5359187) (Chen et al.).

In the article by Menglin et al., a method is described which uses a leakage-current test for detecting TSV-to-substrate shorts due to pinholes in the TSV oxide walls. Analogue test circuitry is provided per TSV, and hence might prove costly in case of having to carry out testing of many TSVs. Moreover, the method requires a very accurate clock distribution to the test circuitry, and does not cover the testing of TSV open circuit defects. In addition, the article does not appear to take into account the fact that TSVs are not manufactured for test purposes only, but need to carry functional signals in their normal operational mode.

In the article by Chen et al., a method is described which tests for both TSV open and short circuit defects by means of writing a digital value, either 0 or 1, to a TSV and determining its discharge time by means of a sense amplifier circuit as found in dynamic random access memory (DRAM) devices. The test infrastructure is per TSV and hence quite costly in the case of having to test many TSVs.

SUMMARY OF CERTAIN INVENTIVE ASPECTS

Certain inventive aspects relate to a measurement system and method that allows TSVs and/or TSV-based interconnects to be tested having access to the TSV under test from one side.

Certain inventive aspects relate to a measurement system which can also allow groups of TSVs and/or TSV-based interconnects to be selected for testing simultaneously.

In accordance with a first aspect of the present disclosure, there is provided a measurement system for measuring the capacitance of at least one device-under-test in an integrated circuit. The system comprises a reference circuit for providing a reference signal, a measurement circuit for providing a measurement signal, the measurement circuit being connectable to each device-under-test, and a comparator for comparing the reference signal with a measurement signal to provide an output signal indicative of the capacitance of the at least one device-under-test. The comparator comprises at least one processing stage for providing an output signal indicative of a time delay between the reference signal and the measurement signal.

In one aspect, a measurement system is provided that can be used to test the functionality of a device-under-test, and in particular, a TSV, by measuring its capacitance from one side thereof. The capacitance of the TSV can be determined by measuring a timing delay introduced due to the presence of the TSV in the measurement circuit. The timing delay of the measurement circuit in which the TSV is connected is determined by comparing the timing of measurement signal from the measurement circuit with the timing of a reference signal provided by the reference circuit. The comparison is preferably carried out using a digital timing measurement circuit.

In one aspect, the measurement system also allows the determination of whether a group of devices-under-test, for example, TSVs is defect-free. If there is a defect in any one of the devices being tested, it will be detected by a change in capacitance compared to the capacitance of defect-free devices. When testing TSVs in groups, re-selection of the TSVs within the group to form smaller groups or subsets of the initial group permits the identification of individual defective TSVs.

In one aspect, the comparator further comprises a time-to-digital converter arranged to receive the output signals from each processing stage and to provide a binary time stamp indicative of the capacitance of the at least one device-under-test.

In one aspect, all measurements take place in the digital domain.

When the integrated circuit to be tested comprises a plurality of devices-under-test, the measurement system further comprises a plurality of multiplexers connected to respective ones of the devices-under-test, each multiplexer being switchable between a normal operational mode and a test operational mode.

Each multiplexer is switched in accordance with a control signal provided by a scan chain.

In one embodiment, each processing stage includes a first buffer for buffering the reference signal and a second buffer for buffering the measurement signal, the first buffer forming part of a slow buffer chain and the second buffer forming part of a fast buffer chain.

Each processing stage further includes a comparator element connected to receive output signals from the first and second buffers, the comparator element providing output signals indicative of the time delay between the reference signal and the measurement signal.

The comparator or timing measurement circuit may be formed as an on-chip circuit for the integrated circuit whose TSVs and/or TSV-based interconnects need to be tested. In addition, the first and second buffers may also be on-chip circuits.

In accordance with another aspect of the present disclosure, there is provided a method for measuring the capacitance of at least one device-under-test using the measurement system described. The method comprises a) providing an input signal, b) making two copies of the input signal, a first copy of the input signal forming the reference signal, c) applying a second copy of the input signal to the measurement signal line, the second copy being modified in accordance with the capacitance value of the at least one device-under-test to form the measurement signal, d) measuring a time delay between the reference signal and the measurement signal, e) comparing the measured time delay to at least one reference value, and f) indicating the presence of a defect in the device-under-test in accordance with the comparison.

In a method to measure the capacitance of a group of TSVs, using the measurement system described above, groups of TSVs to be tested can be selected by switching the multiplexers into a test operational mode. Signals are applied to the reference circuit and to the measurement circuit and are measured by the timing measurement circuit to determine the capacitance of the selected group of TSVs. The capacitance value measured is compared with a set of reference values to determine if all TSVs in the group are defect-free or not. As described above, when at least one defective TSV is detected, the group size can be reduced to be able to identify and isolate each defective TSV.

In one aspect, process d) comprises forming a binary time stamp. In this case, all measurements may be carried out in the digital domain.

The measured time delay corresponds to the capacitance value of the at least one device-under-test. The comparison with the reference value provides information relating to whether a short circuit or an open circuit is present within the device or group of devices being tested.

In one aspect, the test circuit and method allow both pre-bond testing of TSVs before wafer thinning and post-bond testing of TSV-based interconnects. Pre-bond testing TSVs before wafer thinning provides the advantage that only good dies are passed for thinning. This reduces the process cost for thinning inherently bad wafers. Post-bond testing of TSV-based interconnects provides the advantage that only correctly connected stacked dies in 3D ICs are passed for use. By carrying out both pre-bond and post-bond testing, the TSV and its subsequent interconnections can be tested to reduce the overall failure rate and reduce production costs by not thinning and stacking bad dies.

BRIEF DESCRIPTION OF THE DRAWINGS

For a better understanding of the present disclosure, reference will now be made, by way of example only, to the accompanying drawings in which.

DETAILED DESCRIPTION OF CERTAIN ILLUSTRATIVE EMBODIMENTS

Figure 1:
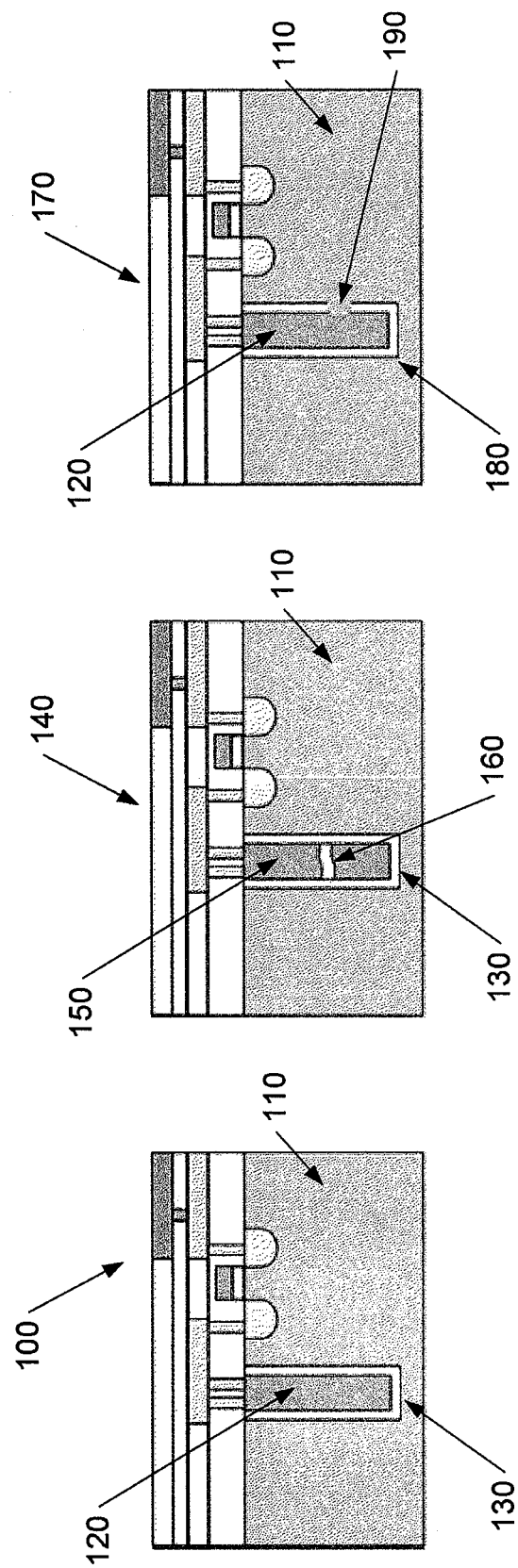
FIGS. 1a, 1b and 1c illustrate respectively a wafer with no TSV-related defects, a wafer containing an open circuit TSV defect and a wafer containing a resistive short TSV defect respectively.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

It will be understood that the terms "vertical" and "horizontal" are used herein refer to particular orientations of the Figures and these terms are not limitations to the specific embodiments described herein.

In accordance with one embodiment, a method and system is described that allows TSV testing and/or testing of the TSV-based interconnect using electrical access from only one side of the TSV.

Common defects in TSVs and TSV-based interconnects comprise open and short circuits. FIGS. 1a, 1b and 1c illustrate a comparison between a good wafer before thinning that has no defects and defective wafers having open circuit and short circuit defects. Common components bear the same reference numerals.

A good wafer 100 is shown in FIG. 1a which comprises a substrate 110 in which a TSV 120 is formed. The TSV 120 is insulated from the substrate 110 by an insulating layer 130.

FIG. 1b shows a wafer 140 having a substrate 110 in which a defective TSV 150 is formed. In this case, the TSV 150 is open circuit as indicated by a crack 160. The insulation layer 130 is undamaged and there is no short circuit between the TSV 150 and the substrate 110.

FIG. 1c shows a wafer 170 having a substrate 110 in which the TSV 120 has no defect but is in an insulating layer 180 which has a short circuit with respect to the substrate 110 as indicated at 190.

Whilst FIGS. 1b and 1c shown two different defects, it will readily be understood that a wafer may include both defects, namely, a defective TSV providing an open circuit and a short circuit through the insulating layer. It will be appreciated that either one of these defects will render the wafer useless.

As described above, it is beneficial to carry out both pre-bonding testing and post-bonding testing. As described previously, pre-bond testing of TSVs is carried out before wafer thinning. Such testing is particularly useful as, with pre-bonding test results, only good wafers are selected for stacking and the defective wafers are discarded. If pre-bond wafer tests are not applied, and wafers are "blindly" stacked on top of one another, the compound yield of the stack becomes rather low, as it requires only one bad wafer in the stack to render the entire stack useless. Ideally, the pre-bond wafer test should cover the intra-wafer circuitry, and preferably also the TSVs themselves. When a wafer is manufactured, TSVs do not stick out of the back-side of the wafer as they are deeply buried within the substrate as shown in FIGS. 1a, 1b and 1c until the wafer is thinned. A typical wafer thickness is 750 μm, while a typical TSV height is between 25 μm and 50 μm. Hence, in a pre-bond wafer test on a thick wafer, that is, a wafer that has not yet been thinned, electrical test access to the TSV can only be from one side.

However, post-bond testing of TSV-based interconnects is also important. For a post-bond test of TSV-based interconnects, there is test access, or connectability, at the input side of the TSV interconnect, and observability at the output side of the TSV interconnect. This can be implemented, for example, through dedicated on-chip Design-for-Test (DfT) hardware implemented in both of the stacked wafers. Unfortunately, such test access is not always available on both sides of the TSV interconnect, for example, in the case where the stacking of a memory wafer with no dedicated DfT on-chip. In that case, electrical access to the TSV-based interconnects is only from one side.

Therefore, when forced to work with electrical access on one side of the wafer only for testing TSVs or TSV-based interconnects, the embodiments described below provide a low-cost and low-complexity solution that can easily be integrated into existing test access infrastructure.

Identification of individual characteristics of a TSV and an assessment of its quality can be modeled as a resistance-capacitance (RC) network where the capacitance, C, is the dominant factor. The values for resistance, R, and capacitance, C, for a TSV is typically of the order of R=20 mΩ and C=60 fF, depending on TSV depth. Naturally, variations on these values are also possible.

A defect in a TSV or TSV-based interconnect will lead to a change in capacitance. By measuring the capacitance of each TSV and comparing the measured value to a reference value, it is possible to detect whether the TSV is defect free or not. Moreover, it is possible to assess the nature of the defect, that is, whether the defect is due to an open circuit or a short circuit. In the case of a TSV open circuit, the normal TSV capacitance will be reduced, depending on where in the TSV the open circuit is located, that is, at what height within the TSV. In the case of a short circuit, the capacitance value will be substantially increased due to the high resistance of the substrate.

If a digital signal is used to drive the TSV, it will take some time to reach its maximum voltage depending on the value of TSV capacitance. The changes in TSV capacitance, due to defects, will lead to a reduced or increased delay in reaching the maximum voltage. This delay, and hence indirectly the change in TSV capacitance, can be measured by means of a time-to-digital Converter (TDC). In accordance with one embodiment of the present disclosure, the TSV is driven from one side and its change in capacitance measured by means of a TDC, all from only one side of the TSV, that is, without requiring test access from both sides of the TSV.

Figure 2:
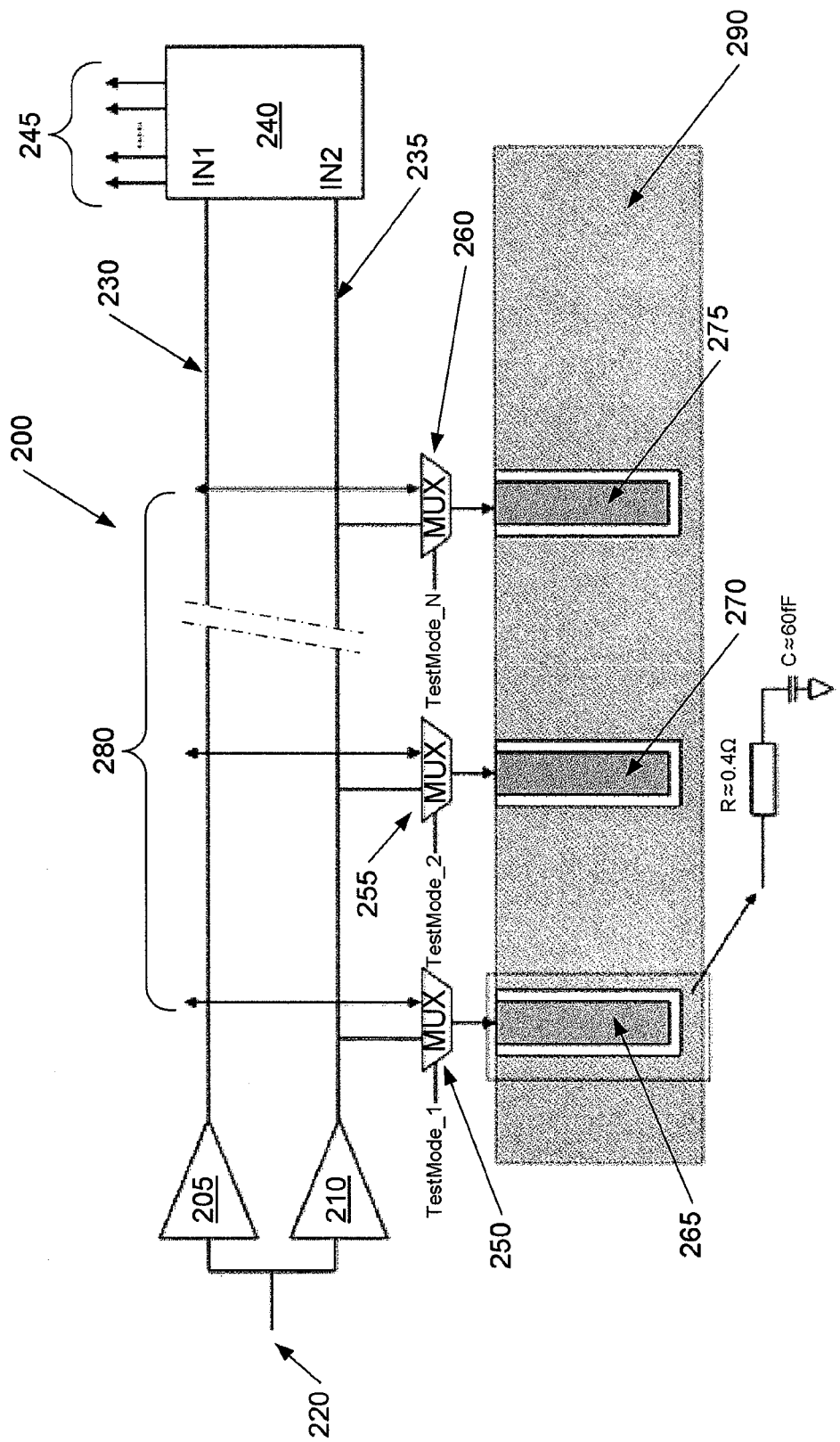
FIG. 2 illustrates a schematic representation of one embodiment of a TSV capacitance measurement circuit.

One embodiment of TSV test circuit 200 in accordance with one embodiment is illustrated in FIG. 2. The circuit 200 comprises a pair of buffers 205, 210 connected to an input 220 and to supply lines 230, 235. The supply lines 230, 235 are connected to a TDC 240 which provides an output 245 and to a plurality of multiplexers (MUXs) 250, 255, 260 as shown. Each MUX 250, 255, 260 is connected to supply and receive signals from a TSV 265, 270, 275 in a test operational mode, and to input/output (I/O) lines 280 in a normal operational mode. Each TSV 265, 270, 275 is mounted in a substrate 290 as shown. I/O lines 280 are not relevant to the present disclosure but to the normal operational mode of the IC on which the TSVs are formed and will therefore not be described further.

The input 220 comprises a digital input signal which is applied to the buffers 205, 210 to generate two copies thereof. One copy comprises a reference signal, IN1, which is passed to supply line 230, and the other copy comprises a measuring signal, IN2, which is passed to supply line 235. Supply lines 230, 235 will now be referred to a reference line 230 and measurement line 235 respectively. Signals on the reference line 230 are passed directly to the TDC 240 and signals on the measurement line 235 are applied to the TSVs being tested. Both the signal on the reference line 230 and the signal on the measurement line 235 are passed to the TDC 240 for comparison and output signal 245 comprises a binary stamp of their time delay difference is generated.

Since each TSV 265, 270, 275 is an active interconnect, the MUXs 250, 255, 260 are used as switches between the "normal" and "test" operational modes. The switch between modes is activated by control signals via TestMode_1, TestMode_2, ... TestMode_N inputs as shown. The control signal of each MUX 250, 255, 260 can be driven by a scan chain, in the same way as with conventional (two-dimensional) DfT (Design for Test) systems.

For the measurement of the capacitance of a TSV, the timing of the signal used to drive the TSV is compared to that of a signal with no TSV generated by the same source. The two signals are then compared by the means of a TDC.

Because all the measurements taking place are in the digital domain, it is very easy to be integrated to existing DfT techniques with small area overheads and low power consumption.

The embodiment of FIG. 2 allows for a trade-off between test time and diagnostic resolution. It is possible to test groups of TSVs simultaneously. The selection of TSVs in such a group can be determined by simple programming of the scan chain that controls the MUX control inputs. By testing TSVs group-wise, the test time can be substantially reduced when compared to the test time for testing TSVs individually.

Whilst this comparison of signals is sufficient for pass/fail detection, no diagnostic information on which TSV in the tested group is failing is provided. However, if diagnostic information on the exact failing TSV is required, it is possible to follow up the testing of groups with testing of smaller groups, ultimately down to a single TSV, to obtain that diagnostic information. If guaranteed detection of even a single defective TSV is required, the group size will be limited by the process variation on TSV capacity and corresponding delay. However, if this test method is used as an early screen and is to be followed up by a true two-sided interconnect test later on, this is less of a constraint.

The operation of the single delay line TDC is based on the generation of equally spaced reference edges. This is achieved by propagating the reference signal IN1 through a delay line while the measured signal IN2 is applied directly to the input of the sampling element. An embodiment of a TDC 300 is shown in FIG. 3.

Figure 3:
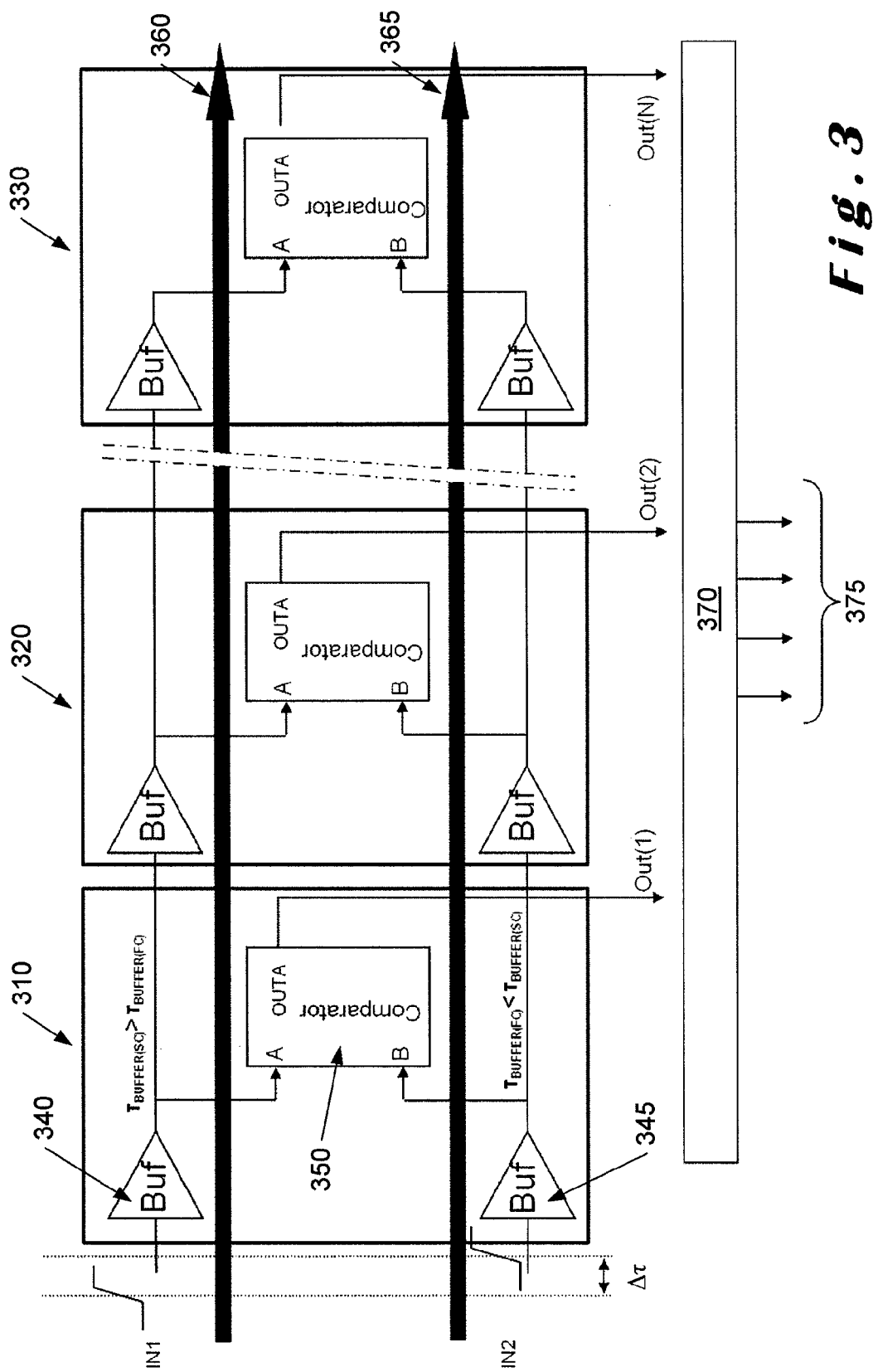
FIG. 3 illustrates a schematic representation of a time-to-digital conversion (TDC) circuit.

In FIG. 3, the TDC 300 comprises a plurality of identical stages 310, 320, 330, one for each TSV to be tested. For clarity and ease of description only the components of one stage will be described in detail, in this case stage 310, but it will be appreciated that subsequent stages from stage 2 to stage N−1 will be identical. The last stage, stage N, is slightly different as will be described below.

Each of stages 2 to N−1 comprises a reference line buffer 340, a measurement line buffer 345 and a comparator 350. Reference signal IN1 forms the input for the reference line buffer 340 in the first stage and the measurement signal IN2 forms the input for the measurement line buffer 345. Output signals from the reference and measurement line buffers 340, 345 of the first stage form input signals for the buffers in the second stage and output signals from the buffers in the second form input signals for the third stage etc., until the Nth stage where output signals from the buffers are only input to the associated comparator.

In each stage, the output signals from the buffers 340, 345 also form inputs for the comparator 350 which provides an output signal Out(N) according to the particular stage number. For example, in stage 310, the output signal is Out(1), for stage 320, the output signal is Out(2) and for stage 330, the output signal is Out(N).

The output from each reference line buffer 340 of each stage forms a slow buffer chain as indicated by arrow 360. Similarly, the output from each measurement line buffer 345 forms a fast buffer chain as indicated by arrow 365. In each case, the output from the last buffer, that is, the buffers in the Nth stage, forms the end of the buffer chain.

Each output signal Out(1), Out(2), . . . , Out(N) is passed to a thermometer-to-binary converter (TBC) 370 where they are added to produce an output signal 375 in the form of a binary time stamp. This output signal 375 corresponds to the capacitance of the group of TSVs being tested.

The rising edge of each reference signal IN1 is use to clock the incoming data. As the two buffers 340, 345 have different time delays, an initial time difference $\Delta\tau$ is then obtained in the form of a thermometer code, which determines the time taken for the stop signal to catch up with the start waveform. This is indicated by a change in the output of the sampling elements, either from HI to LOW or the reverse, which is further explained in the timing diagram of FIG. 4.

Although one TDC implementation is described, it will be appreciated that other TDC implementations are also possible.

Figure 4:
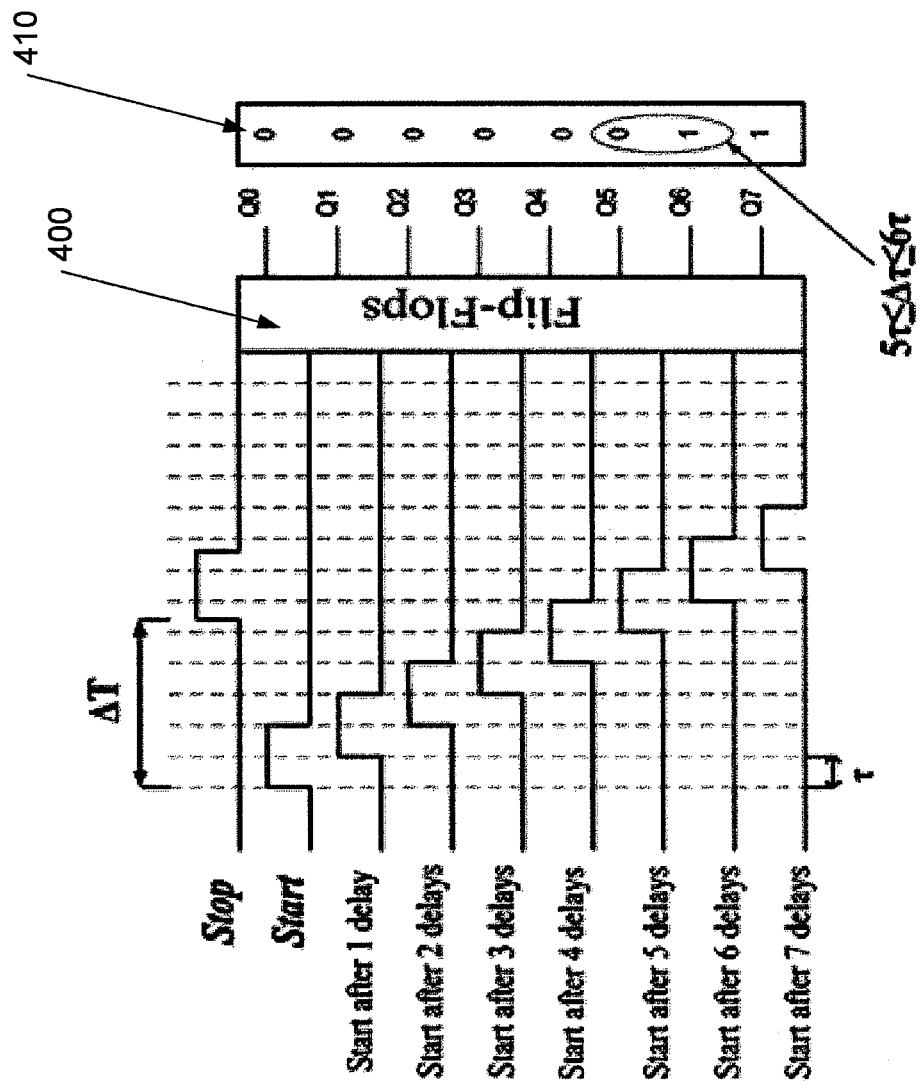
FIG. 4 illustrates a timing diagram of a TDC circuit.

FIG. 4 illustrates a timing diagram in which a 'start' signal and a 'stop' signal are shown together with the delayed 'start' signals. The 'start' and 'stop' signals correspond to respective ones of the reference signal IN1 and the measurement signal IN2. Each delayed 'start' signal has a number of identical delay periods $\tau$ as shown, the delays being between one delay period and seven delay periods. The difference between the 'start' and 'stop' signals is $\Delta T$ as shown, which comprises the number of delay periods therebetween.

Figure 5:
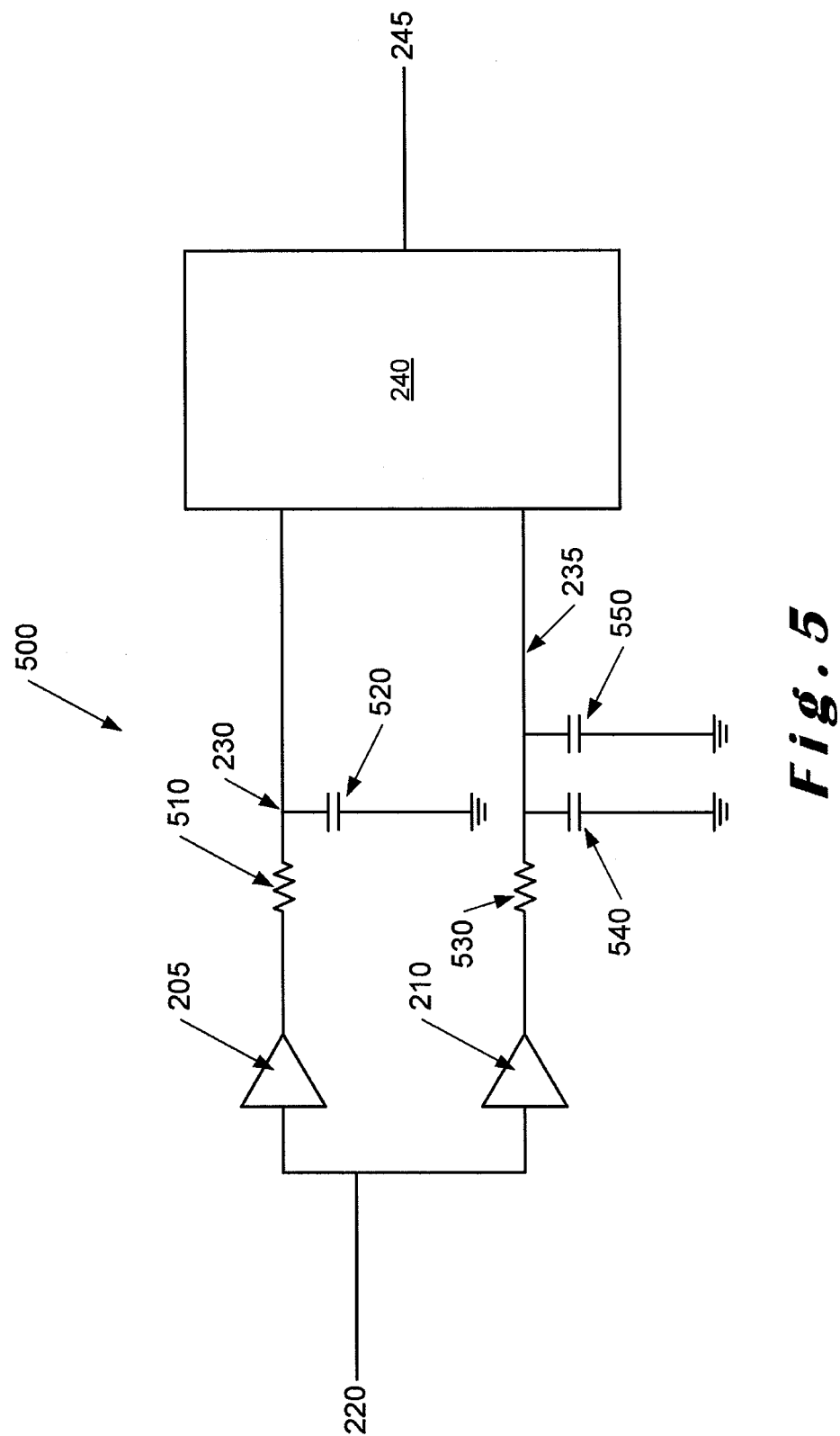
FIG. 5 illustrates a schematic representation of a TSV capacitance measuring circuit in accordance with one embodiment.

FIG. 5 is a schematic illustration of a test circuit 500 in accordance with one embodiment. Components which have previously been described bear the same reference numerals. As described above with reference to FIG. 2, the test circuit 500 comprises a reference circuit 230 and a measurement circuit 235. An input signal 220 is copied by buffers 205, 210 and provided to both the reference circuit 230 and the measurement circuit 235. Output signals from the reference and the measurements circuits 230, 235 are processed in a TDC 240 to provide an output signal 245 indicative of the capacitance value of the TSV(s) being tested in the measurement circuit 235. This capacitance value is then compared with reference values to determine if the TSV(s) in the measurement circuit 235 are defective or not.

In FIG. 5, the reference circuit 230 is shown as being an RC circuit having a resistor 510 and a capacitor 520. Similarly, the measurement circuit 235 is shown as an RC circuit having a resistor 530 and a capacitor 540. However, a further capacitor 550 is present in the measurement circuit 235 that corresponds to the TSV(s) being tested. The TDC 240 compares the signals from both the reference circuit 230 and the measurement circuit 235 to determine the capacitance value of the capacitor 550 relating to the TSV(s) being tested. As described above, a single TSV or a group of TSVs may be tested and therefore the capacitance value of the capacitor 550 can relate to one or more TSVs.

All the signals are applied to a bank 400 of flip-flops which provide output thermometer code signals Q0 to Q7 as a thermometer code output 410 as shown. Each output signal Q0 to Q7 is either a '0' or a '1'. In this example, the IN2 signal has been caught by flip-flop 6 as shown by the change of state from 0 to 1 or from LOW to HIGH, which indicates that the time difference between the IN1 and IN2 signal.

Figure 6:
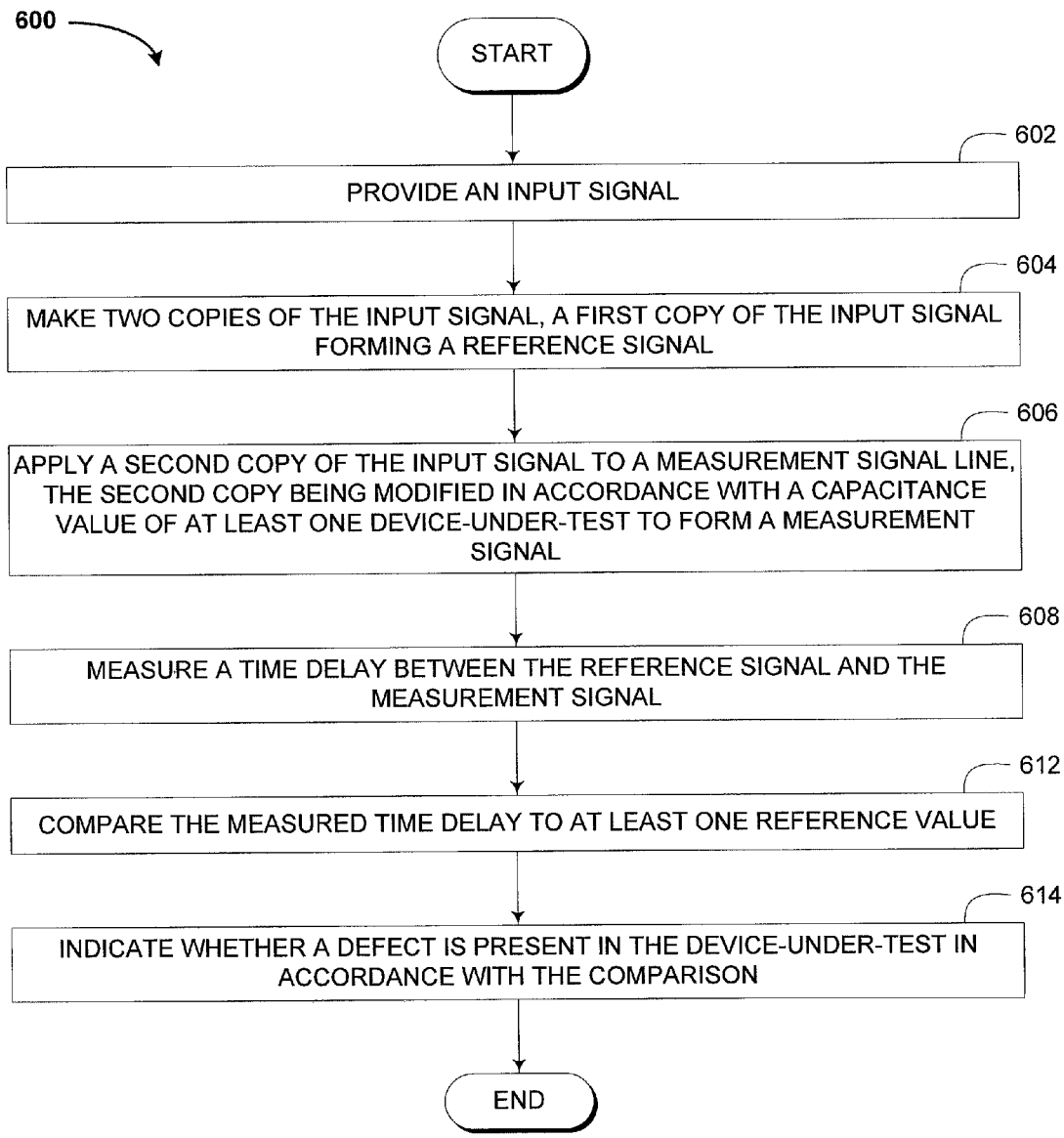
FIG. 6 shows a flowchart of one embodiment of a method of measuring the capacitance of at least one device-under-test.

FIG. 6 shows a flowchart of one embodiment of a method of measuring the capacitance of at least one device-under-test. The method 600 includes providing an input signal in block 602. Next at a block 604, the method includes making two copies of the input signal, a first copy of the input signal forming a reference signal. Moving to block 606, the method includes applying a second copy of the input signal to a measurement signal line, the second copy being modified in accordance with a capacitance value of at least one device-under-test to form a measurement signal. At block 608, the method includes measuring a time delay between the reference signal and the measurement signal. Moving to block 612, the method includes comparing the measured time delay to at least one reference value. Next at block 614, the method includes indicating whether a defect is present in the device-under-test in accordance with the comparison.

Although systems and methods as disclosed, is embodied in the form of various discrete functional blocks, the system could equally well be embodied in an arrangement in which the functions of any one or more of those blocks or indeed, all of the functions thereof, are realized, for example, by one or more appropriately programmed processors or devices.

Thus, one or more aspects of the present invention can be implemented in digital electronic circuitry, or in computer hardware, firmware, software, or in combinations of them. Furthermore, aspects of the invention can be implemented in a computer program product stored in a computer-readable medium for execution by a programmable processor. The processor may be a general purpose, or a special purpose processor, and may be for inclusion in a device, e.g., a chip that has other components that perform other functions. Method steps of aspects of the invention may be performed by a programmable processor executing instructions to perform functions of those aspects of the invention, e.g., by operating on input data and generating output data. Accordingly, the embodiment includes a computer program product which provides the functionality of any of the methods described above when executed on a computing device. Further, the embodiment includes a data carrier such as for example a CD-ROM or a diskette which stores the computer product in a machine-readable form and which executes at least one of the methods described above when executed on a computing device.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology without departing from the disclosure.

What is claimed is:

1. A measurement system for measuring the capacitance of at least one device-under-test in an integrated circuit, the system comprising:
   a reference circuit configured to provide a reference signal;
   a measurement circuit configured to provide a measurement signal, the measurement circuit being connectable to each device-under-test; and
   a comparator configured to compare the reference signal with a measurement signal to provide an output signal indicative of the capacitance of the at least one device-under-test, the comparator comprising at least one processing stage configured to provide an output signal indicative of a time delay between the reference signal and the measurement signal.

2. The measurement system according to claim 1, wherein the comparator further comprises a time-to-digital converter configured to receive the output signal from each processing stage and to provide a binary time stamp indicative of the capacitance of the at least one device-under-test.

3. The measurement system according to claim 1, wherein the integrated circuit comprises a plurality of devices-under-test and the measurement system further comprises a plurality of multiplexers connected to respective ones of the devices-under-test, each multiplexer being switchable between a normal operational mode and a test operational mode.

4. The measurement system according to claim 3, wherein each multiplexer is switched in accordance with a control signal provided by a scan chain.

5. The measurement system according to claim 1, wherein each processing stage comprises a first buffer for buffering the reference signal and a second buffer for buffering the measurement signal, the first buffer forming part of a slow buffer chain and the second buffer forming part of a fast buffer chain.

6. The measurement system according to claim 5, wherein each processing stage further includes a comparator element configured to receive output signals from the first and second buffers, the comparator element providing output signals indicative of the time delay between the reference signal and the measurement signal.

7. The measurement system according to claim 1, wherein the output signal indicative of a time delay is a binary time stamp.

8. The measurement system according to claim 1, wherein the time delay is indicative of the capacitance value of the at least one device-under-test.

9. A measurement system for measuring the capacitance of at least one device-under-test in an integrated circuit, the system comprising:
   means for providing a reference signal;
   means for providing a measurement signal, the measurement signal providing means being connectable to each device-under-test; and
   means for comparing the reference signal with a measurement signal to provide an output signal indicative of the capacitance of the at least one device-under-test, the comparing means comprising at least one processing stage configured to provide an output signal indicative of a time delay between the reference signal and the measurement signal.

10. The measurement system according to claim 9, wherein the comparing means further comprises means for receiving the output signal from each processing stage and for providing a binary time stamp indicative of the capacitance of the at least one device-under-test.

11. The measurement system according to claim 9, wherein the integrated circuit comprises a plurality of devices-under-test and the measurement system further comprises a plurality of multiplexers connected to respective ones of the devices-under-test, each multiplexer being switchable between a normal operational mode and a test operational mode.

12. The measurement system according to claim 11, wherein each multiplexer is switched in accordance with a control signal provided by a scan chain.

13. The measurement system according to claim 9, wherein each processing stage comprises a first buffer for buffering the reference signal and a second buffer for buffering the measurement signal, the first buffer forming part of a slow buffer chain and the second buffer forming part of a fast buffer chain.

14. The measurement system according to claim 13, wherein each processing stage further includes means for receiving output signals from the first and second buffers, the receiving means providing output signals indicative of the time delay between the reference signal and the measurement signal.

15. The measurement system according to claim 9, wherein the output signal indicative of a time delay is a binary time stamp.

16. The measurement system according to claim 9, wherein the time delay is indicative of the capacitance value of the at least one device-under-test.

* * * * *